United States Patent [19]

Shobbrook

[11] 4,302,726

[45] Nov. 24, 1981

[54] CURRENT SOURCES

[75] Inventor: David E. Shobbrook, Greenford, England

[73] Assignee: The General Electric Company Limited, London, England

[21] Appl. No.: 117,496

[22] PCT Filed: Nov. 14, 1978

[86] PCT No.: PCT/GB78/00041

§ 371 Date: Jul. 16, 1979

§ 102(e) Date: Jul. 10, 1979

[87] PCT Pub. No.: WO79/00295

PCT Pub. Date: May 31, 1979

[51] Int. Cl.³ .................... H03F 3/45; H03F 1/34
[52] U.S. Cl. ..................................... 330/260; 330/84; 330/102; 330/104; 330/265; 307/296 R
[58] Field of Search .............. 330/84, 100, 102, 104, 330/105, 260, 265, 271, 293; 307/296, 297

[56] References Cited

U.S. PATENT DOCUMENTS 3,745,477  7/1973  Freeborn ..................... 330/260 X

FOREIGN PATENT DOCUMENTS 849316  9/1960  United Kingdom ............... 330/293

Primary Examiner—James B. Mullins
Attorney, Agent, or Firm—Kirschstein, Kirschstein, Ottinger & Cobrin

[57] ABSTRACT

A current source in which the output current from an output amplifier stage (2) is controlled by an input signal, originating in a signal source (11), to an input amplifier stage (1) incorporates, additionally to a negative feedback path from the current input path of the output stage (2) to the input amplifier (1), monitoring means (5) in the signal input path to the output amplifier (2) and control means (4) in an input path to the input amplifier (1). Monitoring means (5) monitors the current flow in the input path to the output amplifier (2) and applies, via control means (4) a signal to the input amplifier (1) such that the dependence of the current flow in the current output path on the gain of the output stage (2) is reduced. A circuit is described, as well as an application to driving a telephone subscriber line and using two current sources working in push-pull mode.

8 Claims, 3 Drawing Figures

CURRENT SOURCES

This invention relates to current sources and in particular to such current sources in which the magnitude of the output current of the source is determined by the magnitude of a control voltage.

Conventional current sources which are designed to produce an output current whose magnitude is a function of an input signal to the source, are frequently provided with a negative feedback loop whose function it is to keep the output current as nearly as possible to the required magnitude.

In practice such current sources may comprise a multi-stage amplifier, with the input signal being applied to an input of a first stage and the current output being provided by an output stage. As long as the requirements of accuracy of trans-conductance are not too stringent, the output stage frequently consists of a single transistor, with the feedback signal being derived from the emitter circuit of the transistor. However, when a high degree of accuracy is required, it has heretofore been necessary, in general, to use so-called "Darlington" or other multiple transistors in the output stage, which tend to increase the cost of the current source, particularly in application involving high voltages.

It is an object of the present invention to provide an accurate current source which does not require the use of multiple transistors.

According to one aspect of the present invention, in a current source arrangement in which the magnitude of current flow in an output path of an amplifier stage is arranged to be dependent on the magnitude of an input signal applied to an amplification stage preceding said amplifier stage, there are provided also at least two feed back paths from said amplifier stage to said preceding amplification stage, one of which feed back paths serves to inject into the amplification stage a negative feed back signal whose magnitude is dependent on the current flow in said output path, another one of the feed back paths being arranged to transmit a signal dependent on a current flowing in an input to said amplifier stage such as to reduce the dependence of the current flow in said output path on the gain of said amplifier stage.

In accordance with another aspect of the present invention in a current source arrangement in which the magnitude of current flowing in an output path of a transistor amplifier stage is arranged to be controlled by a control signal applied to an input of the arrangement, said control signal being applied to the transistor amplifier stage by way of a differential amplifier to an input of which is also applied a negative feedback signal whose magnitude is dependent upon that of said current in said output path, there are provided means to provide a further feedback signal to an input of said differential amplifier whose value is dependent upon the input current to said transistor amplifier stage such as to reduce the dependence of the current flowing in said output path on the gain of the transistor amplifier stage.

The control signal and the said further feedback signal are conveniently applied to a non-inverting input of the differential amplifier, and the negative feedback signal to an inverting input thereof. The negative feedback signal may be derived from the voltage drop across a resistive element in the emitter circuit of an output transistor in the transistor amplifier stage. The said further feedback signal is conveniently derived from a first resistive element in the control signal input path of the transistor amplifier and applied to the non-inverting input via a second resistive element, with the control signal being applied to the same input of the differential amplifier via a third resistive element.

In accordance with a further aspect of the present invention a current source arrangement comprises a differential amplifier having inverting and non-inverting inputs and an output, and a transistor having an input electrode, an output electrode, and a control electrode, the input electrode being connected by way of a resistive element to one pole of power supply means and the output electrode being connected by way of a load circuit to the other pole of said power supply means, the output of the differential amplifier being electrically coupled to the control electrode of the transistor, means to apply a control signal to one input of the differential amplifier, feedback means to apply to another input of the differential amplifier a signal dependent upon the voltage developed in operations across said resistive element, and further means for deriving a signal dependent on the current flow through the control electrode of the transistor, said further means being electrically connected to said one input of the differential amplifier.

Preferably, said differential amplifier is a high gain amplifier having substantially linear amplification characteristics, of the kind known as operational amplifiers.

Said further means for deriving a signal dependent on the current flow through the control electrode of the transistor conveniently comprises a first resistive element connected between the output of the differential amplifier and the control electrode of the transistor, thereby also electrically coupling said output to said control electrode, a second resistive element by means of which the output of the differential amplifier is connected to said one input thereof, and a third resistive element connecting said one input thereof, and a third resistive element connecting said one input to a source of said control signal whereby said control signal is applied to said one input.

The control signal applied in operation of the current source to said one input may be a DC signal voltage derived from a resistance divider network.

Said control signal may also include an AC component superimposed on the DC signal in a known manner.

A current source arrangement in accordance with the present invention is suitable for use with electronic line units for telephone systems.

A current source arrangement in accordance with the present invention will now be described by way of example with reference to the accompanying drawing, of which:

Figure 1:
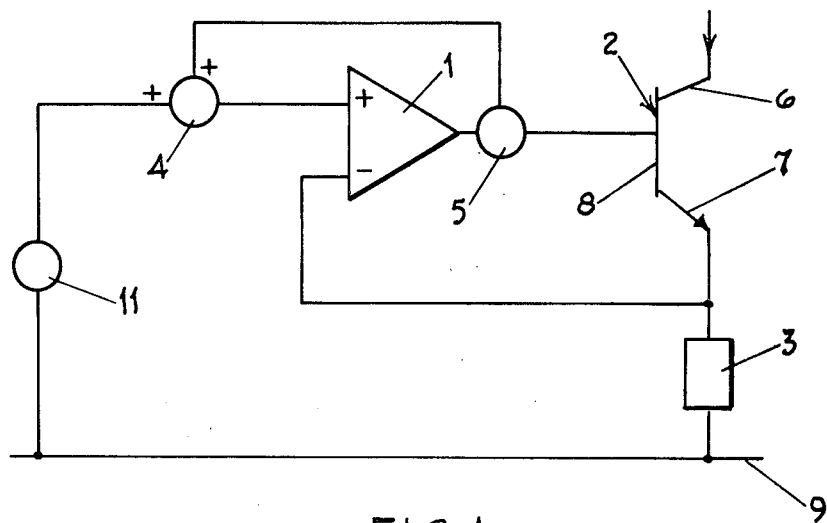
FIG. 1 shows the current source arrangement schematically.

Referring first to FIG. 1, a current source in accordance with the present invention comprises a high gain linear amplification stage provided by an operational amplifier 1, and an amplifier stage in the form of a junction transistor 2, whose control electrode, or base, 8 is electrically coupled with the output of the amplifier 1. The input electrode, or emitter 7, of the transistor 2 is connected to the inverting input of the amplifier 1 and also, via a close tolerance resistor 3, to a voltage rail 9. Connected to the non-inverting input of the amplifier 1 is a voltage source 11 supplying a control signal voltage to the amplifier and hence to the base 8 of the transistor 2, the value of the control voltage determining the current flow at the output electrode, or collector 6, of the transistor 2. Additionally control means 4 and 5 are connected to the non-inverting input and the output respectively of the amplifier 1, arranged to derive a signal dependent on base current of the transistor 2 and to apply a signal to the non-inverting input of the amplifier 1 such that the dependence of the collector current on the gain of the transistor is reduced. A load circuit (not shown) to be driven by this current source arrangement is connected in use to the collector 6 of the transistor 2.

A signal indicative of the base current is derived by means 5 and is fed by means of the control means 4 into the non-inverting input of the amplifier, any deviation of this signal from its design value as determined by the control voltage causing a variation in the signal applied to the non-inverting input. A consequent change in current flow through the emitter and hence the resistor 3 results in a change of the voltage applied to the emitter and thus compensates for this signal variation thereby bringing the collector current nearer to the intended value.

The operation of a particular embodiment of this constant current source will become apparent from the description below with reference to FIG. 2 of the drawings, in which parts easily identifiable as being equivalent to components of FIG. 1 carry the same reference.

Figure 2:
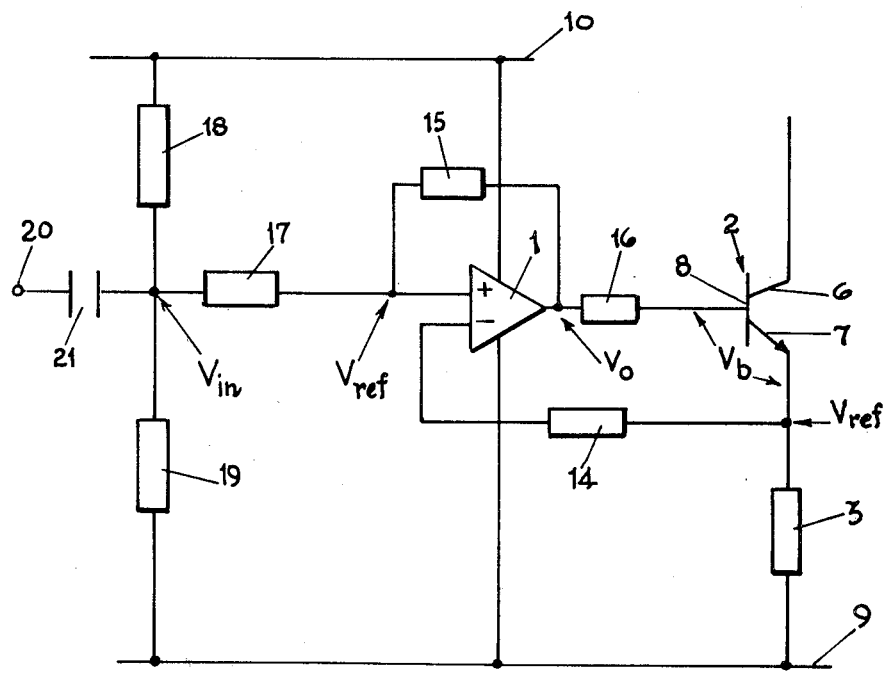
FIG. 2 shows the current source arrangement diagrammatically.

Referring now to FIG. 2, the output of the operational amplifier 1 is coupled by means of a resistor 16 to the base 8 of the transistor 2, whose emitter 7 is connected to the voltage rail 9 by way of a resistor 3 and to the inverting input of the amplifier 1 through a resistor 14 which serves as a feedback path and can also be arranged to equalize the source impedances to the two inputs of the amplifier. A resistance divider network comprising resistors 18 and 19 connected across the voltage rails 9 and 10, from which power is also supplied to the amplifier 1, provides the biassing DC control voltage onto which may be superimposed an AC control voltage in the form of an AC signal applied to the terminal 20 of the capacitor 21. The biassing voltage derived from the resistance network 18, 19 and, where applicable, the AC signal is applied to the non-inverting input of the amplifier 1 through a resistor 17, with a resistor 15 connecting this input to the output of the amplifier. The influence of resistors 14, 18, and 19 on the AC performance of the current source is negligible. the accuracy of the current source can be made dependent solely on resistor matching, thus obviating the need to adjust each individual source in dependence on the individual performance characteristics of the transistor used, as the following calculation shows, in which:

$V_{in}$ = the voltage obtained from the resistance divider network.
$V_{ref}$ = the voltage at the non-inverting input of the amplifier.
$V_o$ = the voltage at the output of the amplifier.
$V_b$ = the voltage between base and emitter of the transistor
$I_b$ = the base current of the transistor
$I_e$ = the emitter current of the transistor
$I_c$ = the collector current of the transistor
$r_e$ = the dynamic emitter-base resistance of the transistor
$R_3$ = the resistance value of resistor 3, etc.

Summing currents at the non-inverting input of the operational amplifiers, one obtains:

$$\frac{V_{in} - V_{ref}}{R_{17}} + \frac{V_o - V_{ref}}{R_{15}} = 0 \tag{1}$$

Rearranging this expression gives:

$$V_{ref} = V_{in}\frac{R_{15}}{R_{17} + R_{15}} + V_o\frac{R_{17}}{R_{17} + R_{15}} \tag{2}$$

But, since current flow through the resistor $R_3$ will tend to stabilise at a value such that the voltage at the emitter electrode 7 of the transistor 2 is virtually equal to $V_{ref}$:

$$V_o = V_{ref} + V_b + I_bR_{16} \tag{3}$$

Defining
$$V_{bDc} = V_b - I_e r_e \tag{4a}$$

$$= V_b - V_{ref}\frac{r_e}{R_3},$$

writing $r_e/R_3 = k$ and substituting for $V_b$ from equation (4b) in equation (3) yields:

$$V_o = V_{ref}(1+k) + V_{bDc} + I_bR_{16} \tag{5}$$

Using this equation (5) in equation (2) gives $$V_{ref} = \frac{V_{in}R_{15}}{R_{15} - kR_{17}} + \frac{V_{bDc}R_{17}}{R_{15} - kR_{17}} + \frac{I_bR_{16}R_{17}}{R_{15} - kR_{17}} \tag{6}$$

However, $$I_c = \frac{V_{ref}}{R_3} - I_b \tag{7}$$

and by substitution from equation (6)

$$I_c = \frac{V_{in}R_{15}}{R_3(R_{15} - kR_{17})} + \frac{V_{bDc}R_{17}}{R_3(R_{15} - kR_{17})} + \frac{I_bR_{16}R_{17}}{R_3(R_{15} - kR_{17})} - I_b \tag{8}$$

In order to make the collector current $I_c$ independent of the base current $I_b$, and hence of the current amplification $\beta$, where $$\beta = I_c/I_b \tag{8a}$$

it is necessary to ensure that $$\frac{R_{16}R_{17}}{R_3(R_{15} - kR_{17})} = 1, \tag{9}$$

or given k is small, to a first order that $$R_{16}/R_{15} = R_3/R_{17} \tag{10}$$

Thus under DC conditions the accuracy of the current source subject to the restrictions (9) and (10) above is indeed dependent only on resistor matching and independent of the current gain $\beta$ of the transistor.

Any deviation of $I_c$ from the predicted value is caused by variations in $V_{bDc}$ and resistive tolerances which result in imperfect cancellation of the base current $I_b$ and hence in an error in the transconductance $dI_c/dV_{in}$ of the circuit, i.e. the variation of collector current $I_c$ in dependence on $V_{in}$.

The error in the quiescent current under DC conditions is the same as that in the AC case dealt with below, except for the additional error due to $V_{bDc}$ variations. As this error is substantially independent of the absolute value of the collector current $I_c$, only the differential of $I_c$ with respect to $V_{bDc}$ needs to be calculated. Thus, from equation (8)

$$\frac{dI_c}{dV_{bDc}} = \frac{R_{17}}{(R_{15} - kR_{17}) R_3}$$

which on account of equation (10) yields $$dI_c/dV_{bDc} = 1/R_{16}$$

and therefore
$$dI_c = dV_{bDc}/R_{16} \quad (11)$$

i.e. the effect of variation in $V_{bDc}$, as defined by equation (4a), on the collector current $I_c$ is inversely proportional to the resistance value of resistor 16.

Although being sufficient for a calculation of the accuracy of the constant current source under DC conditions, the first order approximation expressed in equation (9) above is not precise enough to permit an assessment of the accuracy of the current source under AC conditions. A good approximation is, however, possible by using a sensitivity analysis, for a given resistor $R_3$, involving the transconductance $$g_m = \frac{dI_c}{dV_{in}}$$

and the current gain $\beta$ of the transistor.

Rearranging equation (8), using the relationship (8a) between $I_c$ and $I_b$, and defining a resistor ratio X as $$X = \left[1 - \frac{R_{16}R_{17}}{R_3(R_{15} - kR_{17})}\right] \quad (12)$$

gives $$g_m = \frac{1}{R_3}\left[\frac{R_{15}}{R_{15} - kR_{17}}\right] \times \left[\frac{\beta}{X + \beta}\right]$$

The sensitivity factor S for a fractional change $\Delta g_m/g_m$ caused by a fractional change $\Delta\beta/\beta$ is defined by $\Delta g_m/g_m = S\,\Delta\beta$, providing (13) a measure for the dependence between the two variables.

In the limit of infinitesimal changes dgm and d$\beta$ expression (13) becomes $$dg_m/g_m = S\,d\beta/\beta \quad (14)$$

i.e.

$$S = \beta/g_m \times dg_m/d\beta \quad (15)$$

Substituting for $g_m$ from equation (12) gives $$\beta/g_m \times dg_m/d\beta = X/(X+\beta) \quad (16)$$

It follows that the dependence of $g_m$ on $\beta$ is only slight by virtue of X being a very small number approaching 0 in the case of ideal resistor matching. Ideally, the $\beta$ dependence of the transconductance is removed completely but for practical values of X there still is a very slight dependence on account of the finite current gain.

Expressions similar to (16) can be derived for the sensitivity of the current source to changes of the transconductance $g_m$ with respect to $R_3$ and X, viz:

$$R_3/g_m \times dg_m/dR_3 = -1 \quad (17)$$

and $$X/g_m\, dg_m/dD\ -X/(X+\beta) \quad (18)$$

Equation (17) shows that variations in $g_m$ are directly proportional to variations in $R_3$, underlining the necessity for a very low tolerance resistor 3.

The effect of variations in the resistor ratio on $g_m$ is very low as shown by (18), the physical explanation being that the tolerance of resistor ratio X proportionally effects the base current, but the base current itself is only a small proportion of the total collector current.

The performance of the circuit shown in FIG. 2 has been evaluated in practical tests, with the resistor ratio X being realized to an accuracy of 0.03%. Measurements carried out showed no discernible difference over the audio frequency range between the predicted and the actual transconductance.

Using different transistors 1 with current gains between 20 and 100, worst possible resistor tolerances of $\pm 0.1\%$ and a perfect operational amplifier, the error between predicted and measured performance is still less than $\pm 0.2\%$ under AC conditions.

Typical variations in $V_{bDc}$ for a power transistor are $\pm 100$ mV resulting in a change of the collector current of approximately $\pm 50$ $\mu$A, i.e. $\pm 0.2\%$ of the quiescent current.

The near-independence of the output current with respect to the gain of the transistor as achieved in the fore-going current source arrangement allows easy matching of two or more such current source arrangements.

Figure 3:
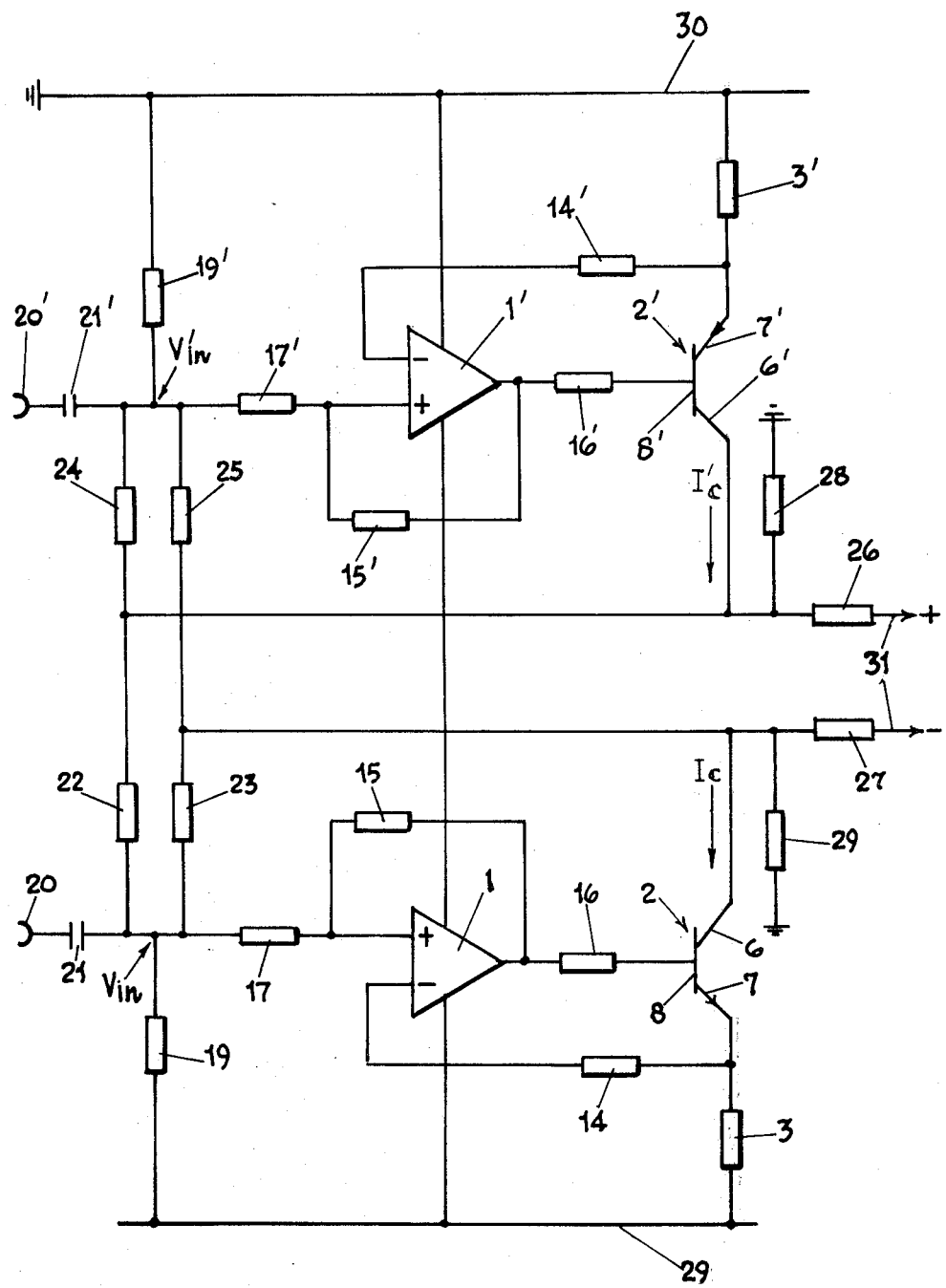
FIG. 3 shows, in diagrammatic form, a circuit incorporating two complimentary current source arrangement in push-pull mode.

Although a current source in accordance with the invention will give, for the same applied DC control signal voltage, the same current output over a large range of transistor gains, the value at which the source output stabilizes may vary slightly between different sources, for instance on account of resistor tolerances. These variations will, in general, be small enough to be of no consequence when replacing one source with another. However, if two current sources are simply connected in series to work in a push-pull mode, e.g. to drive a telephone subscriber's line, even the slightest mismatch between the current outputs of the two sources may present problems in that, as each of the current sources attempts to keep the common output current to a value appropriate to its own stable state, one or the other of the sources may saturate and cease to operate in the above described manner. A circuit arrangement designed to overcome this problem is shown in FIG. 3.

Thus, each of the two current sources making up the circuit comprises an operational amplifier 1, $1^1$, whose output is connected, by way of a resistor 116, $16^1$ to the base of the transistor $2,2^1$ respectively, with transistor 2 being an n-p-n transistor, and transistor $2^1$ being a nominally matched, complementary p-n-p transistor. The use of a matched pair of complementary transistors $2,2^1$ provides for the impedance presented by each current source to the respective line of the two wire line 31 to be equal, since thereby the collectors 6 and $6^1$ of the transistors 2 and $2^1$ are connected respectively to the positive line (+) and the negative line (−) of the two wire line 31. The other end of the two wire line 31 is connected to a load circuit (not shown) such as e.g. a subscriber's instrument.

The feed back paths of each of the two current sources, that is the negative feed back path via resistors 14 and $14^1$, and the further feed back path including resistors 15 and 16, and $15^1$ and $16^1$ respectively, are identical in arrangement and function to the corresponding feed back paths of the circuit shown in FIG. 2.

The power supply to the arrangement is by means of voltage rail 29, carrying a negative voltage of suitable magnitude, and grounded voltage rail 30.

Also connected between the voltage rails 29 and 30 is a resistor divider network comprising resistors 22, 23, 24, 25, all having the same value, and equal reistors 19 and $19^1$.

This resistor network determines the average voltage of the two wire line, i.e. the mean of the voltages on the positive and the negative line of the two wire line 31.

If the two current sources of the arrangement are perfectly matched, the average voltage of the line pair lies half way between the voltage levels at rails 29 and 30. If, however, the two current sources are imperfectly matched, that is to say that they stabilize individually at different current levels of collector current for the same applied control input voltage, the average voltage of the two wire line 31 moves away from this half way point, in a direction so as to decrease the voltage between the collector and the corresponding current rail of that transistor which draws the higher current and increase the corresponding voltage at the other circuit. This shift of the average voltage at the two wire line, also termed common mode shift causes an equal and opposite change, with respect to the nearest current rail, of the input voltage levels $V_{in}$ and $V_{in}^1$, the change being such that the current flow through that transistor, which initially drew the higher current, is reduced and the current flow through the other transistor is increased. This common mode shift is arrested when both transistors draw the same current, with the average voltage stabilizing at the new value. Resistors 22 to 25 thus form, in conjunction with resistors 19 and $19^1$, a third feed back path which ensures that the collector currents of the two transistors 2 and $2^1$ are equal, i.e. that $I_c = I_c^1$.

A differential voltage change, on the other hand, which causes the two lines of the two wire line 31 to move individually away from the average voltage in opposite directions, leaves the average voltage unchanged, and thus will produce no change in the levels of $V_{in}$ and $V_{in}^1$. If therefore an antiphase AC signal is applied to the terminals 20 and $20^1$, and the output currents $I_c$ and $I_c^1$ vary, in antiphase, in accordance wih that signal, no feed back effect will be produced. Provided also, that the resistors 22 to 24 are approximately equal to twice the appropriate value of resistor 18 of FIG. 2 in order to leave the above calculations unchanged, the third feed back path does not, therefore interfere with the AC operation of the arrangement.

In a similar way, the currents $I_c$ and $I_c^1$ are not affected by any differential signal produced within the two wire line, such as may be produced in a subscriber's instrument.

As aforesaid, the collector currents $I_c$ and $I_c^1$ are largely unaffected by differential signals generated within the two wire line circuit, but respond only to either a common mode voltage shift, due to e.g. imperfect matching of the two current sources of an asymmetry in the line circuit on account of leakage currents, or to antiphase signals applied to the terminals 20 and $20^1$. Therefore, by providing a further circuit (not shown) which is unaffected by variations in the collector currents, but detects differential signals which are generated within the two wire line circuit, the present arrangement may be incorporated in, and form part of an electronic hybrid circuit. The detection of such line generated signals may be achieved in the following way. When signals are sent to the subscriber's instrument, that is when antiphase signals are applied to the terminals 20 and $20^1$, then the emmiter and collector voltages generated by a given transistor are out of phase with each other, and by suitable addition these voltages may be made to cancel each other, and consequently no output signal is provided by said further circuit. Differential signals which are generated within the line circuit do, however, produce in-phase collector and emmiter voltages at each of the transistors, resulting in an output signal at the said further circuit. The arrangement including a said further circuit thus provides for a separation of incoming and outgoing signals as is required for an electronic hybrid circuit such as may be used in the conversion from two wire to four wire transmission and vice versa.

Resistors 26 and 27, and non-linear devices 28 and 29 on the positive and the negative line respectively form part of an overvoltage or lightning protection arrangement. The devices 28 and 29 may e.g. be non-linear resistors, or zener diodes. In the constant current sources described above, known means for providing the DC control voltages, other than resistor divider networks may of course be employed, and any other modifications of the current sources above, which are obvious to those skilled in the art are included in the scope of the present invention.

I claim:

1. A current source arrangement in which the magnitude of current flowing in an output path of a transistor amplifier stage is arranged to be controlled by an input signal applied to an input of the arrangement, said input signal being applied to the transistor amplifier stage by way of a differential amplifier, comprising means to derive a negative feedback signal whose magnitude is dependent upon that of said current in said output path, means to apply said negative feedback signal to an input of said differential amplifier, means to derive a further feedback signal whose magnitude is dependent upon the value of input current to said transistor amplifier stage, and means to apply said further feedback signal as a positive feedback signal to an input of said differential amplifier whereby to reduce the dependence of the current flowing in said output path on the gain of the transistor amplifier stage.

2. A current source arrangement as claimed in claim 1, wherein said input signal is applied to a non-inverting input of said differential amplifier, to which is also applied said further feedback signal.

3. A current source arrangement as claimed in claim 1, wherein the said further feedback signal is derived from at least one first resistive element in the input-signal input path of the transistor amplifier and applied to the non-inverting input of the differential amplifier via at least one second resistive element, with the input-signal being applied to the same input of the differential amplifier via at least one third resistive element.

4. A circuit arrangement for driving a two wire telephone subscriber line incorporating two current source arrangements in accordance with claim 1 operating in push-pull mode and having outputs of the respective transistor amplifier stages connected to respective lines of the two wire line, and means to apply said input signal to one of said two current source arrangements inverted with respect to the other of said current sources.

5. A circuit arrangement as claimed in claim 4, wherein a third feedback path comprising a resistor divider network interconnecting said respective lines and the respective inputs of said current source arrangements is arranged to hold the mean voltage of both lines of said two wire line at a level intermediate the voltage provided by power supply means to the circuit arrangement.

6. A current source arrangement comprising a differential amplifier having inverting and non-inverting inputs and an output, and a transistor having an input electrode, an output electrode, and a control electrode, the input electrode being connected by way of a resistive element to one pole of power supply means and the output electrode being connected by way of a load circuit to the other pole of said power supply means, the output of the differential amplifier being electrically coupled to the control electrode of the transistor, means to apply a control signal to one input of the differential amplifier, feedback means to apply to another input of the differential amplifier a first feedback signal dependent upon the voltage developed in operation across said resistive element, means to derive a second feedback signal dependent on the current flow to the control electrode of the transistor, and means to apply said second feedback signal as a positive feedback signal to said one input of the differential amplifier.

7. A current source arrangement as claimed in claim 6, wherein said means to derive the second feedback signal comprises a first resistive element connected between the output of the differential amplifier and the control electrode of the transistor, a second resistive element connecting the output of the differential amplifier to said one input thereof, and a third resistive element connecting said one input to a source of said control signal whereby said control signal is applied to said one input.

8. A current source as claimed in claim 6 wherein the control signal applied in operation of the current source to said one input has a DC signal voltage component derived from a resistor divider network.

* * * * *